United States Patent
Branca

(10) Patent No.: US 10,868,522 B2
(45) Date of Patent: Dec. 15, 2020

(54) SQUARE PULSE OPTICAL TRANSMISSION CIRCUIT

(71) Applicant: STMicroelectronics (Alps) SAS, Grenoble (FR)

(72) Inventor: Xavier Branca, Sassenage (FR)

(73) Assignee: STMicroelectronics (ALPS) SAS, Grenoble (FR)

( * ) Notice: Subject to any disclaimer, the term of this patent is extended or adjusted under 35 U.S.C. 154(b) by 996 days.

(21) Appl. No.: 15/363,743

(22) Filed: Nov. 29, 2016

(65) Prior Publication Data
US 2017/0317665 A1    Nov. 2, 2017

(30) Foreign Application Priority Data
Apr. 27, 2016   (FR) .................................. 16 53749

(51) Int. Cl.
| | |
|---|---|
| *G01C 3/08* | (2006.01) |
| *H03K 3/015* | (2006.01) |
| *H03K 17/78* | (2006.01) |
| *G01S 7/484* | (2006.01) |
| *G01S 17/10* | (2020.01) |
| *H02M 7/537* | (2006.01) |
| *H03K 3/017* | (2006.01) |

(52) U.S. Cl.
CPC .............. *H03K 3/015* (2013.01); *G01S 7/484* (2013.01); *G01S 17/10* (2013.01); *H02M 7/537* (2013.01); *H03K 3/017* (2013.01); *H03K 17/78* (2013.01)

(58) Field of Classification Search
CPC ........ H03K 3/015; H03K 17/78; H03K 3/017; H02M 7/537; G01S 17/10; G01S 7/484
See application file for complete search history.

(56) References Cited

U.S. PATENT DOCUMENTS

| | | | |
|---|---|---|---|
| 7,551,463 B2* | 6/2009 | Ros ..................... | H02M 1/4258 323/288 |
| 2014/0211192 A1* | 7/2014 | Grootjans .............. | H05B 45/14 356/5.01 |
| 2016/0216369 A1* | 7/2016 | Kumarakrishnan .... | G01S 7/484 |

OTHER PUBLICATIONS

"REAL3 image sensor family—3D depth sensing based on Time-of-Flight," Infineon, Product Brief, Nov. 2015, 2 pages.
"Reference Design Brief CamBoard pico flexx," Infineon, pmdtechnologies gmbh, <http://pmdtec.com/picoflexx/downloads/PMD_RD_Brief_CB_pico_flexx_V0201_pdf, Jun. 1, 2016, 1 page.
"800mA Triple Output Laser Diode Driver," Intersil, ISL58303 Data Short, Sep. 1, 2016, 2 pages.
"Close interaction time-of-flight 2D depth-sensing camera," SoftKinetic, DS325 Datasheet, Sep. 7, 2012, 2 pages.
(Continued)

*Primary Examiner* — Samantha K Abraham
(74) *Attorney, Agent, or Firm* — Slater Matsil, LLP

(57) ABSTRACT

An optical emission circuit includes a power supply source and a regulation circuit coupled to control the power supply source. An optical source and a first switch are coupled in series to the power supply source. A square pulse signal source has an output coupled to a control input of the first switch. The square pulse signal source is configured to provide a square pulse signal. The regulation circuit regulates the current supplied by the power supply source according to a product of a peak current set point by a duty cycle of the square pulse signal.

24 Claims, 2 Drawing Sheets

(56) References Cited

OTHER PUBLICATIONS

"Illumination Driving for Time-of-Flight (ToF) Camera System," Texas Instruments, Application Report, SBAA209A, Revised Oct. 2016, 17 pages.
"OPT8241 3D Time-of-Flight Sensor," Texas Instruments, OPT8241, SBAS704B, Revised Oct. 2015, 34pgs.
"OPT9221 Time-of-Flight Controller," Texas Instruments, OPT9221, SBAS703A, Jun. 2015, 104 pages.

* cited by examiner

US 10,868,522 B2

SQUARE PULSE OPTICAL TRANSMISSION CIRCUIT

CROSS-REFERENCE TO RELATED APPLICATIONS

This application claims the priority benefit of French patent application number 1653749, filed on Apr. 27, 2016, the content of which is hereby incorporated by reference in its entirety to the maximum extent allowable by law.

TECHNICAL FIELD

The present invention relates to a square pulse optical transmission circuit.

BACKGROUND

Certain cameras enabling to acquire three-dimensional images are based on a so-called "time-of-flight" technology. A camera of this type can be embarked in a self-contained device such as a cell phone. The camera emits a square-pulse optical radiation, for example, infrared, towards a scene. The optical pulses are emitted at a frequency generally in the range from 10 to 200 MHz with an average power of several watts. The elements of the scene send back the pulses towards a sensor comprising a detection pixel array. The sensor measures an offset time (time of flight) of the optical pulses for each pixel and distance information is thus obtained. A time-of-flight technology may be used in devices such as, for example, proximity sensors or focusing devices for photographic cameras.

Supplying square-pulse optical emissions raises various problems. Optical emission circuits which overcome all or part of these problems are desired to be obtained.

SUMMARY

The present invention relates to the field of electronic circuits and, in particular embodiments, to a circuit that is enabled to emit optical pulses.

An embodiment provides an optical emission circuit that comprises an optical source and a first switch series-connected to a power supply source controlled by a regulation circuit. The first switch is controlled by a source of a square pulse signal. The regulation circuit regulates the current supplied by the power supply source according to the product of a peak current set point by the duty cycle of the square pulse signal.

According to an embodiment, the frequency of the square pulse signal is greater than 10 MHz and the regulation circuit has a cut-off frequency having a ratio to the frequency of the square pulse signal smaller than 1/5.

According to an embodiment, the peak current set point is analog and the regulation circuit comprises a low-pass filter having its input receiving the peak current set point via a second switch controlled by the square pulse signal, and a reference potential via a third switch controlled by the inverse square pulse signal.

According to an embodiment, the peak current set point is analog and is supplied by a digital-to-analog converter having its input connected to a digital circuit.

According to an embodiment, the power supply source comprises a switched-mode DC-DC converter intended to be powered by a battery.

According to an embodiment, the semiconductor elements, except for the square pulse signal source and the optical source, are comprised within a single electronic chip.

An embodiment provides an optical emission method, wherein a square pulse signal controls a switch applying a voltage to an optical source, the current in the optical source being regulated according to the product of a peak current set point by the duty cycle of the square pulse signal.

According to an embodiment, the square pulse signal has a frequency greater than to MHz and the regulation has a cut-off frequency having a ratio to the frequency of the square pulse signal smaller than 1/5.

According to an embodiment, said product is obtained by a low-pass filtering of the product of the peak current set point by the square pulse signal.

The foregoing and other features and advantages will be discussed in detail in the following non-limiting description of specific embodiments in connection with the accompanying drawings.

BRIEF DESCRIPTION OF THE DRAWINGS

For a more complete understanding of the present invention, reference is now made to the following descriptions taken in conjunction with the accompanying drawings, in which.

DETAILED DESCRIPTION OF ILLUSTRATIVE EMBODIMENTS

Figure 1A:
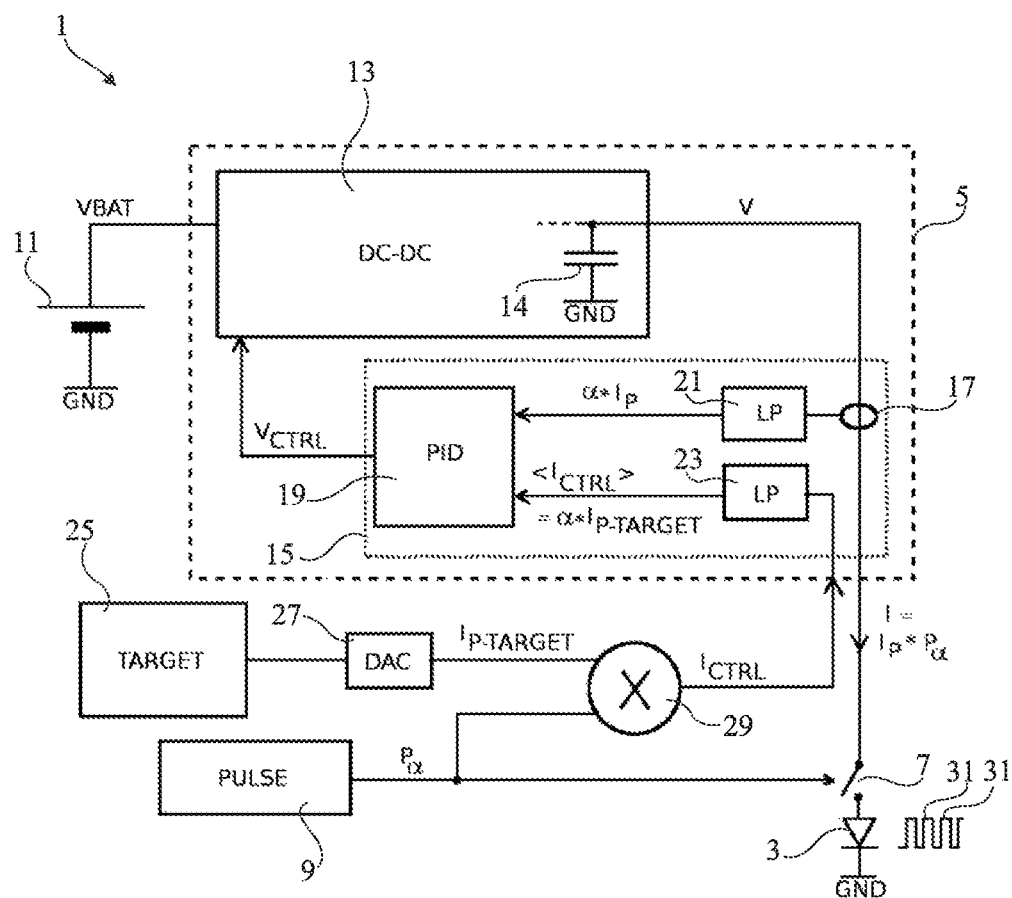
FIG. 1A illustrates an embodiment of an optical pulse emission circuit.

The same elements have been designated with the same reference numerals in the different drawings. For clarity, only those steps and elements which are useful to the understanding of the described embodiments have been shown and are detailed. In particular, elements currently comprised in conventional electronic circuits such as a voltage source or a PID regulator are not shown.

In the following description, when reference is made to position-qualifying terms, such as term "left-hand", "right-hand", reference is made to the orientation of the concerned element in the drawings.

FIG. 1A illustrates an embodiment of an optical pulse emission circuit 1.

Circuit 1 comprises an optical source, for example, a light-emitting diode 3. Diode 3 is coupled to a current source 5 by a switch 7 controlled by a circuit 9 (PULSE) for generating a square pulse signal $P_\alpha$. Switch 7 for example comprises a MOS transistor and a circuit for driving the MOS transistor, not shown. Source 5 supplies a current I regulated according to a control signal $I_{CTRL}$. A battery 11 supplies a power supply voltage VBAT referenced with respect to a ground GND. Battery 11 is for example a battery of a self-contained device such as a cell phone having circuit 1 included therein.

Current source 5 comprises a DC-DC voltage source 13 powered with voltage VBAT and supplying a voltage V between the terminals of an output capacitor 14 connected to ground GND. As an example, voltage V is supplied by a switched-mode converter comprising transistors controlled by pulse-width modulation PWM. Voltage V is regulated according to a control voltage $V_{CTRL}$. Set point voltage $V_{CTRL}$ is generated by a regulation circuit 15 comprising a sensor 17 of the current supplied by source 5 and a control circuit 19. Control circuit 19 receives the value measured by sensor 17 and control signal $I_{CTRL}$ via respective low-pass filters 21 and 23 (LP). Control circuit 19 is for example a PID (proportional-integral-derivative) regulator. As an example, current sensor 17 comprises a circuit for measuring the voltage across a resistor, not shown, series-connected with diode 3 and with switch 7.

A digital circuit 25 (TARGET) and a digital-to-analog converter 27 (DAC) are provided to supply an analog peak current set point $I_{P\text{-}TARGET}$.

A multiplier circuit 29 receives peak current set point $I_{P\text{-}TARGET}$ and square pulse signal $P_\alpha$, and supplies control signal $I_{CTRL}$.

The operation of circuit 1 will now be described in relation with FIG. 1B.

Figure 1B:
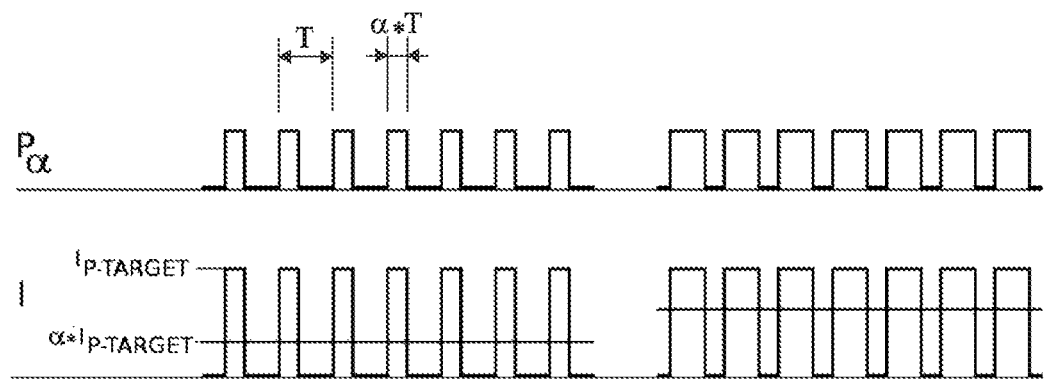
FIG. 1B illustrates a square pulse signal and the current flowing through a diode arranged in the circuit of FIG. 1A.

FIG. 1B illustrates square pulse signal $P_\alpha$ and current I flowing in operation in diode 3. Square pulse signal Pa has a frequency 1/T and a duty cycle α. Square pulse signal Pa is here considered as varying between 0 and 1. Its average value is thus equal to duty cycle α. The timing diagrams on the right-hand side and on the left-hand side in FIG. 1B correspond to two different duty cycles.

For each period of the square pulse signal, diode 3 is powered with voltage V via switch 7 for a time α*T. A peak current $I_P$ then flows through the diode. An optical pulse 31 of duration α*T is thus emitted. During the rest of the period, no significant current flows. The current supplied by source 5 thus has a value $I=I_P*P_\alpha$. Capacitance 14 stabilizes voltage V at the times when switch 7 switches state.

Low-pass filters 21 and 23 have cut-off frequencies much lower than frequency 1/T of signal $P_\alpha$. The ratio of frequency 1/T to the cut-off frequency of filters 21 and 23 is for example greater than 5. Thereby, control circuit 19 receives average value $<I_P*P_\alpha>=\alpha*I_P$ of the current in the diode and average value $<I_{CTRL}>$ of control signal $I_{CTRL}$.

Control circuit 19 adjusts control voltage $V_{CTRL}$ so that average values $\alpha*I_P$ and $<I_{CTRL}>$ are equal. Thus, the ratio of average control value $<I_{CTRL}>$ to the value of peak current $I_P$ is equal to duty cycle α, that is: $<I_{CTRL}>/I_P=\alpha$.

Multiplier circuit 29 is provided so that the provided control signal $I_{CTRL}$ is equal to the product of peak current set point $I_{P\text{-}TARGET}$ by signal $P_\alpha$. Control signal $I_{CTRL}$ is thus such that $<I_{CTRL}>=\alpha*I_{P\text{-}TARGET}$. Thus, peak current $I_P$ of the pulses in the diode is equal to peak current set point $I_{P\text{-}TARGET}$.

According to an advantage of the embodiment described herein, peak current $I_P$ supplied to diode 3 does not depend on duty cycle α of square pulse signal $P_\alpha$ generated by circuit 9. The maximum intensity of the optical pulses generated by diode 3 is thus independent from the duty cycle. This is particularly advantageous since, in practice, all the semiconductor elements of the circuit are formed in a same chip, except for square pulse signal generation circuit 9 and the optical source. This chip is intended to receive from an external circuit a square pulse signal having a duty cycle which is not known until the circuit is operating.

This advantage is obtained since the average current in the diode is regulated according to the product of the peak current set point by the duty cycle of the square pulse signal. It can be observed that, if a current pulse was directly applied to the control of regulation circuit 15 without having been previously multiplied by the duty cycle, an average current equal to this current set point would be obtained, and the peak current would depend on the duty cycle. The fact of applying to regulation circuit 15 a control signal having its average value corresponding to the product of the duty cycle by the peak current set point enables to guarantee the maximum intensity of the optical pulses, whatever the duty cycle.

Further, in case of a heating of the diode, the maximum intensity of the optical pulses is guaranteed whatever the temperature and the resulting characteristics of the diode.

As an example, frequency 1/T of signal $P_\alpha$ may be in the range from 10 to 200 MHz. Filter 21 has a cut-off frequency smaller than 2 MHz. Filter 23 may have a cut-off frequency smaller than 2 MHz. As an example, current source 5 enables to supply a current in the range from 0.1 to 5 A under a voltage in the range from 2 to 6 V.

Figure 2:
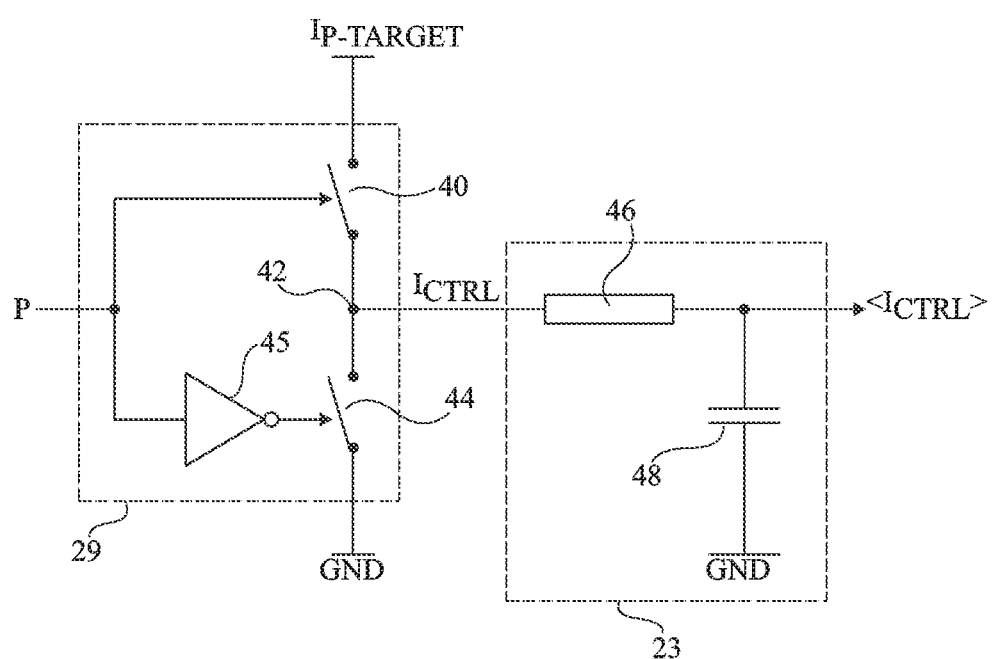
FIG. 2 illustrates, as an example, an embodiment of a multiplier circuit and of a low-pass filter.

FIG. 2 illustrates as an example an embodiment of multiplier circuit 29 and of low-pass filter 23. Circuit 29 comprises a switch 4o between a node of application of peak current set point $I_{P\text{-}TARGET}$ and a node 42 which supplies control signal $I_{CTRL}$. A switch 44 connects node 42 to ground GND. Switch 40 is controlled by square pulse signal $P_\alpha$. Switch 44 is controlled by the inverse square pulse signal supplied by an inverter 45 receiving signal $P_\alpha$. Filter 23 comprises a resistor 46 connected to node 42 and series-connected with a grounded capacitor 48. The average control value $<I_{CTRL}>$ is supplied by the junction point of resistor 46 and of capacitor 48.

Switches 7, 40, and 44, being in a same chip, may be selected in adapted fashion to avoid a drift between the duty cycle of control signal $I_{CTRL}$ and the duty cycle of current I in the diode.

Specific embodiments have been described. Various alterations, modifications, and improvements will occur to those skilled in the art. In particular, filters 21 and 23 may be located in the circuit at any adapted location enabling to regulate the average current in diode 3 according to the product of the peak current set point by the duty cycle of the square pulse signal. The function of low-pass filter 21 may be ensured by current sensor 17, the latter then directly measuring the value of the average current in the diode. The functions of filters 21 and 23 may be ensured by all the elements which take part in the dynamic response of the voltage source according to set point $V_{CTRL}$, such that, for example, capacitor 14 and PID regulators internal to voltage source 13. Filters 21 and 23 may also be included in control circuit 19. Further, the filters may be digital or analog filters.

Although a specific multiplier circuit has been described, the multiplier circuit may be replaced with any other circuit capable of supplying a signal having its average value corresponding to the product of the peak current set point by the duty cycle of the square pulse signal.

Further, although, in the described embodiments, diode 3 and switch 7 are series-connected in a specific layout, any other layout of diode 3 in series with switch 7 between the terminals of a voltage source is possible. Current sensor 17 may be positioned in any manner enabling to measure the current supplied by the voltage source.

Although, in the described embodiments, the optical source comprises a diode, the optical source may comprise any other element capable of generating an optical radiation according to a current, the optical source may comprise a laser source or may comprise more than one diode, in particular.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An optical emission circuit comprising:
   a power supply source;
   a regulation circuit coupled to control the power supply source;
   an optical source;
   a first switch, the optical source and the first switch being coupled in series to the power supply source; and
   a square pulse signal source having an output coupled to a control input of the first switch, the square pulse signal source configured to provide a square pulse signal at the output coupled to the control input of the first switch, wherein the regulation circuit is configured to regulate a current supplied by the power supply source according to a product of a peak current set point and a duty cycle of the square pulse signal.

2. The circuit of claim 1, wherein a frequency of the square pulse signal is greater than 10 MHz.

3. The circuit of claim 2, wherein the regulation circuit has a cut-off frequency having a ratio to the frequency of the square pulse signal, the ratio being smaller than 1/5.

4. The circuit of claim 1, wherein the peak current set point is analog and the regulation circuit comprises a low-pass filter having an input receiving the peak current set point via a second switch controlled by the square pulse signal, the low-pass filter being selectively connected to a reference potential via a third switch controlled by an inverse of the square pulse signal.

5. The circuit of claim 1, wherein the peak current set point is analog and is supplied by a digital-to-analog converter having an input connected to a digital circuit.

6. The circuit of claim 1, wherein the power supply source comprises a switched-mode DC-DC converter.

7. The circuit of claim 6, wherein the switched-mode DC-DC converter includes a battery terminal input that is configured to be coupled to a battery.

8. The circuit of claim 1, wherein the power supply source, the regulation circuit, and the first switch are disposed on a single electronic chip, the square pulse signal source and the optical source comprising components coupled to the single electronic chip.

9. The circuit of claim 1, further comprising:
   a peak current set point source;
   a second switch having a control input configured to be coupled to receive the square pulse signal and a current path coupled between the peak current set point source and the regulation circuit;
   a third switch having a control input configured to be coupled to receive an inverse of the square pulse signal and a current path coupled between a reference potential and the regulation circuit wherein the current paths of the second and third switches are coupled in series between the peak current set point source and the reference potential, and wherein the regulation circuit comprises a low-pass filter having an input coupled to a node between the second switch and the third switch; and
   wherein the power supply source, the first switch, and the regulation circuit are disposed on a single semiconductor substrate.

10. An optical emission method, comprising:
    generating a square pulse signal; and
    using the square pulse signal to control a switch that applies a voltage to an optical source, a current in the optical source being regulated according to a product of a peak current set point and a duty cycle of the square pulse signal.

11. The method of claim 10, wherein the square pulse signal has a frequency greater than 10 MHz and the regulation circuit has a cut-off frequency having a ratio to the frequency of the square pulse signal that is smaller than 1/5.

12. The method of claim 11, further comprising obtaining the product of the peak current set point and the duty cycle of the square pulse signal by low-pass filtering a product of the peak current set point and the square pulse signal.

13. An electronic circuit comprising:
    a power supply source comprising a power input and a control input;
    a first switch having a current path between a first terminal and a second terminal, the first terminal configured to be coupled to an optical source and the second terminal being coupled to an output of the power supply source, a control input of the first switch being configured to receive a square pulse signal; and
    a regulation circuit coupled to the control input of the power supply source, wherein the regulation circuit is configured to regulate current supplied by the power supply source according to a product of a peak current set point and a duty cycle of the square pulse signal.

14. The electronic circuit of claim 13, wherein the power supply source, the first switch, and the regulation circuit are disposed on a single semiconductor substrate.

15. The electronic circuit of claim 13, wherein a frequency of the square pulse signal is greater than 10 MHz and wherein the regulation circuit has a cut-off frequency having a ratio to the frequency of the square pulse signal smaller than 1/5.

16. The electronic circuit of claim 13, further comprising:
    a peak current set point source;
    a second switch having a control input configured to be coupled to receive the square pulse signal and a current path coupled between the peak current set point source and the regulation circuit; and
    a third switch having a control input configured to be coupled to receive an inverse of the square pulse signal and a current path coupled between a reference potential and the regulation circuit.

17. The electronic circuit of claim 16, wherein the current paths of the second and third switches are coupled in series between the peak current set point source and the reference potential, and wherein the regulation circuit comprises a low-pass filter having an input coupled to a node between the second switch and the third switch.

18. The electronic circuit of claim 16, wherein the peak current set point source comprises a digital circuit coupled to a digital-to-analog converter, an output of the digital-to-analog converter being coupled to the current path of the second switch.

19. The electronic circuit of claim 13, wherein the power supply source comprises a switched-mode DC-DC converter.

20. An optical emission circuit comprising:
    the electronic circuit of claim 13;
    a battery coupled to the power input of the power supply source;
    an optical source coupled to the first terminal of the first switch; and
    a square pulse signal source coupled to the control input of the first switch.

21. The optical emission circuit of claim 20, wherein the power supply source, the regulation circuit, and the first switch are disposed on a single electronic chip, the battery, the optical source, and the square pulse signal source comprising components external to the single electronic chip.

22. A circuit comprising:
- a power supply source comprising a power input and a control input;
- a regulation circuit coupled to the control input of the power supply source;
- a first switch having a current path between a first terminal and a second terminal, the first terminal configured to be coupled to an optical source and the second terminal being coupled to an output of the power supply source, a control input of the first switch being configured to receive a square pulse signal;
- a peak current set point source;
- a second switch having a control input configured to be coupled to receive the square pulse signal and a current path coupled between the peak current set point source and the regulation circuit; and
- a third switch having a control input configured to be coupled to receive an inverse of the square pulse signal and a current path coupled between a reference potential and the regulation circuit, wherein the current paths of the second and third switches are coupled in series between the peak current set point source and the reference potential, wherein the regulation circuit comprises a low-pass filter having an input coupled to a node between the second switch and the third switch.

23. The circuit of claim 22, further comprising:
- a battery coupled to the power input of the power supply source;
- an optical source coupled to the first terminal of the first switch; and
- a square pulse signal source coupled to the control input of the first switch.

24. The circuit of claim 22, wherein the regulation circuit is configured to regulate current supplied by the power supply source according to a product of a peak current set point and a duty cycle of the square pulse signal.

* * * * *